(12) United States Patent
Flynn et al.

(10) Patent No.: US 7,770,010 B2
(45) Date of Patent: Aug. 3, 2010

(54) DYNAMICALLY CONFIGURABLE INTERLEAVER SCHEME USING AT LEAST ONE DYNAMICALLY CHANGEABLE INTERLEAVING PARAMETER

(75) Inventors: James P. Flynn, San Francisco, CA (US); Boris G. Tankhilevich, Walnut Creek, CA (US)

(73) Assignee: Wideband Semiconductors Inc., Mountain View, CA (US)

( * ) Notice: Subject to any disclaimer, the term of this patent is extended or adjusted under 35 U.S.C. 154(b) by 0 days.

(21) Appl. No.: 11/974,578

(22) Filed: Oct. 14, 2007

(65) Prior Publication Data

US 2008/0276138 A1  Nov. 6, 2008

Related U.S. Application Data

(63) Continuation-in-part of application No. 10/846,056, filed on May 15, 2004, now abandoned, which is a continuation-in-part of application No. 09/663,273, filed on Sep. 18, 2000, now abandoned.

(51) Int. Cl.
   *H04L 9/32*     (2006.01)
   *G06F 11/00*    (2006.01)
   *H03M 13/03*   (2006.01)

(52) U.S. Cl. .................. 713/171; 714/701; 714/702; 714/787; 714/788

(58) Field of Classification Search .............. 713/171; 714/701, 702, 787, 788
   See application file for complete search history.

(56) References Cited

U.S. PATENT DOCUMENTS

| | | | | |
|---|---|---|---|---|
| 5,042,033 A * | 8/1991 | Costa | ......................... | 714/701 |
| 5,483,541 A * | 1/1996 | Linsky | ........................ | 714/701 |
| 5,537,420 A * | 7/1996 | Huang | ......................... | 714/701 |
| 5,572,532 A * | 11/1996 | Fimoff et al. | .............. | 714/702 |
| 5,592,492 A * | 1/1997 | Ben-Efraim et al. | ......... | 714/702 |
| 5,596,604 A * | 1/1997 | Cioffi et al. | ................. | 375/260 |
| 5,636,242 A * | 6/1997 | Tsujimoto | .................... | 375/130 |
| 5,677,911 A * | 10/1997 | Fimoff et al. | .............. | 714/701 |
| 5,737,337 A * | 4/1998 | Voith et al. | ................... | 714/702 |
| 5,745,497 A * | 4/1998 | Ben-Efraim et al. | ........ | 714/702 |
| 5,764,649 A * | 6/1998 | Tong | ........................... | 714/701 |
| 5,852,614 A * | 12/1998 | Stephens et al. | ............ | 714/701 |
| 5,889,791 A * | 3/1999 | Yang | ........................... | 714/752 |
| 5,912,898 A * | 6/1999 | Khoury | ........................ | 714/701 |
| 6,003,147 A * | 12/1999 | Stephens et al. | ............ | 714/701 |
| 6,014,761 A | 1/2000 | Lachish et al. | | |
| 6,055,277 A * | 4/2000 | Stephens et al. | ............ | 375/285 |
| 6,178,530 B1 * | 1/2001 | Aman et al. | ................. | 714/702 |
| 6,304,609 B1 * | 10/2001 | Stephens et al. | ............ | 375/259 |
| 6,310,907 B1 * | 10/2001 | Tsujimoto | .................... | 375/141 |
| 6,411,654 B1 * | 6/2002 | Furutani et al. | ............. | 375/262 |
| 6,556,617 B1 * | 4/2003 | Tsujimoto | .................... | 375/141 |

(Continued)

*Primary Examiner*—Joseph D Torres
(74) *Attorney, Agent, or Firm*—Boris G. Tankhilevich

(57) ABSTRACT

A method for encrypting and decrypting an original data stream comprising: (A) transmitting a copy of a key to an interleaver and to a de-interleaver, wherein the key includes a key-algorithm configured to describe an evolution in time of at least one interleaving parameter; (B) interleaving the original data stream by using the interleaver, wherein the interleaver compensates for a change in latency caused by at least one dynamically changeable interleaving parameter; and (C) recovering the original data stream from the interleaved data stream propagated through the communication channel by using the de-interleaver adapted to communicate with the communication channel, wherein the de-interleaver compensates for a change in latency caused by at least one dynamically changeable interleaving parameter.

9 Claims, 11 Drawing Sheets

U.S. PATENT DOCUMENTS 6,614,767 B1 * 9/2003 Marko et al. ................. 370/321
6,631,491 B1 * 10/2003 Shibutani et al. ............ 714/762
6,634,009 B1 * 10/2003 Molson et al. ................. 716/1
6,658,566 B1 * 12/2003 Hazard ....................... 713/172

* cited by examiner

Dummy-stuffed Transition Block

Transition Block Bytes for n = m-1

| X | X | X |
|---|---|---|
| 4 | 2 | 0 |
| 5 | 3 | 1 |
| X | X | X |

140 ⟶ Transition Block Bytes for n = m-1, m = 4, n = 3, P = [0,1,2,3,4,5]

FIG. 8

| X | X | X |     | X | X | X |
|---|---|---|-----|---|---|---|
| 4 | 2 | 0 |     | 4 | 3 | 0 |
| 5 | 3 | 1 | $F_y(X) \rightarrow$ | 5 | 2 | 1 |
| X | X | X |     | X | X | X |

150 ⟶ $F_y(X)$ Performed on Transition Block for m = 4, n = 3

FIG. 9

| X | X | X | X |     | X | X | X | X |
|---|---|---|---|-----|---|---|---|---|
| 9 | 6 | 3 | 0 |     | 9 | 8 | 4 | 0 |
| 10| 7 | 4 | 1 | $F_y(X) \rightarrow$ | 10| 6 | 5 | 1 |
| 11| 8 | 5 | 2 |     | 11| 7 | 3 | 2 |
| X | X | X | X |     | X | X | X | X |

170 ⟶ $F_y(X)$ Performed on Transition Block for m = 5, n = 4

FIG. 10

180 — Division of Transition Block

190 — Division Performed on Transition Block for m = 4, n = 3

200 — Division Performed on Transition Block for m = 5, n = 4

210 — Transition Block for m = 8, n = 4

Clock Validation Example
Clock
Clock Valid (Active Low)

340

Equivalent 'Gated Clock' Example
Clock

360

Generalized Diagram of Possible Implementation of Dynamically
Configurable Interleaver/Deinterleaver System.
Note that Parts of this Design May Appear in Both the Encoder and Decoder.

DYNAMICALLY CONFIGURABLE INTERLEAVER SCHEME USING AT LEAST ONE DYNAMICALLY CHANGEABLE INTERLEAVING PARAMETER

This is a continuation-in-part of the U.S. patent application Ser. No. 10/846,056, entitled: "DYNAMICALLY CONFIGURABLE INTERLEAVER SCHEME", and filed on May 15, 2004 now abandoned, which is a continuation-in-part of the U. S. patent application Ser. No. 09/663,273, entitled: "OPTIMIZED RAM REPRESENTATION OF CONVOLUTIONAL INTERLEAVER/DE-INTERLEAVER DATA STRUCTURE", and filed on Sep. 18, 2000 now abandoned.

BACKGROUND OF THE INVENTION

1. Field of the Invention

This invention relates to the art of electronic data transmission, and more specifically, to a method and apparatus employing a dynamically configurable interleaver scheme.

2. Discussion of the Background Art

Error correction and error detection codes have been used extensively in data communication and data storage applications. In a data communication application, data is encoded prior to transmission, and decoded at the receiver. In a data storage application, data is encoded when stored in a storage device, e.g. in a disk drive, and decoded when retrieved from the storage device.

In a typical application of error detection and correction codes, data symbols are stored in blocks, wherein each block of data symbols includes a selected number of special symbols, called check symbols. A symbol may consist of a single bit or multiple bits. The check symbols in each block represent redundant information concerning the data stored in the block. When decoding the blocks of data, the check symbols are used to detect both the presence and the locations of errors and, in some instances, to correct these errors. The theory and applications of error correction codes are well-known to those skilled in the art. For reference, please see "Error Control Coding: Fundamentals and Applications", by Shu Lin and Daniel J. Costello, Jr., Prentice-Hall, 1983.

In a typical application of error correction codes, the input data is divided into fixed-length blocks ("code words"). For a linear block (n, k) code, each code word consists of n symbols, of which fixed number k is data symbols, and the remaining (n-k) symbols are check symbols. The linear block code can be defined in terms of generator and parity-check matrices. As mentioned above, the check symbols represent redundant information about the code word and can be used to provide error correction and detection capabilities.

The decoding of linear block codes typically is based on a set of "syndromes" computed from a remainder polynomial. The set of "syndromes" is obtained by dividing the code word by the generator polynomial. Ideally, if no error is encountered during the decoding process, all computed syndromes are zero. A non-zero syndrome indicates that one or more errors exist in the code word. Depending on the nature of the generator polynomial, the encountered error may or may not be correctable. If the generator polynomial can be factorized, a syndrome computed from the remainder polynomial obtained by dividing the received code word by one of the factors of the generator polynomial is called a "partial syndrome".

One can view the code words as occupying the vertices of a cube in an n-dimensional space. Choosing a good set of code words for a code consists of choosing a set of vertices which have good distance properties in the n-dimensional space. The probability of error between two blocks of binary digits is reduced by increasing the Hamming distance between the code words, which is defined as the number of symbol positions at which two code words differ. In such an error correction code, two code words differ by a distance of one, if they differ at one symbol position, regardless of the number of bit positions these code words differ within the corresponding symbols at that symbol position.

The capability of an error correction or detection code is sometimes characterized by the size of the maximum error burst the code can correct or detect. For example, a convenient capability measure is the "single error burst correction" capability, which characterizes the code by the maximum length of consecutive error bits the code can correct, as measured from the first error bit to the last error bit, if a single burst of error occurs within a code word. Another example of a capability measure would be the "double error burst detection" capability, which characterizes the error correction or error detection code by the maximum length of each error burst the error correction code can detect, given that two or less bursts of error occur within a code word.

Because errors often occur in bursts in some types of channels (for instance, in the Rayleigh fading channel), a technique, called "interleaving", is often used to spread the consecutive error bits or symbols into different "interleaves", which can each be corrected individually. Interleaving is achieved by creating a code word of length 'nw' from 'w' code words of length 'n'. In one method for forming the new code word, the first w symbols of the new code word are provided by the first symbols of the w code words taken in a predetermined order. In the same predetermined order, the next symbol in each of the w code words is selected to be the next symbol in the new code word. This process is repeated until the last symbol of each of the w code words is selected in the predetermined order into the new code word.

Another method to represent a w-way interleaved code is to replace a generator polynomial G(X) of an (n, k) code by the generator polynomial $G(X^w)$. This technique is applicable, for example to the Reed-Solomon codes. Using this new generator polynomial $G(X^w)$, the resulting (nw, kw) code has the error correcting and detecting capability of the original (n, k) code in each of the w interleaves so formed.

There are two basic types of prior art interleaver: a block interleaver and a convolutional interleaver. The block interleaver has a rectangular configuration and is represented by a matrix having N number of columns and M number of rows, that is the block interleaver includes two interleaving parameters: (N, M). The input data is typically written into the block interleaver by column, and is read out by row. On the receiving end, after the data is transmitted over a channel generating bursts of errors, the block de-interleaver writes the received data by row, and reads the data out by column, thus randomly spreading the bursts of errors in time.

A convolutional prior art interleaver has two interleaving parameters: a number of branches L, and a delay D: (L, D). The first branch of the convolutional interleaver includes a minimum delay zero, wherein the last L-th branch includes the maximum delay: (L-1)D. A convolutional de-interleaver includes the matching parameters: the L number of branches, and the same D delay. However, the last L-th branch of the convolutional de-interleaver includes a minimum delay zero, wherein the first branch includes the maximum delay: (L-1) D. For a digital video broadcast channel (DVB channel), the parameters of the convolutional interleaver are such: there are L=12 branches, and the delay D=17.

SUMMARY OF THE INVENTION

To address the shortcomings of the available art, the present invention provides for a method and an apparatus for encrypting an original data stream entering a communication channel, and for recovering the original data stream from the interleaved data stream received at the end of the communication channel.

One aspect of the present invention is directed to a method for encrypting and decrypting an original data stream.

In one embodiment, the method of the present invention comprises: (A) transmitting a copy of a key to an interleaver and to a de-interleaver, wherein the interleaver is placed at a transmitting end of a communication channel, and wherein the de-interleaver is placed at a receiving end of the communication channel, wherein the key includes a key-algorithm configured to describe an evolution in time of at least one interleaving parameter, wherein at least one interleaving parameter is being dynamically changed during data transmission through the communication channel according to the key-algorithm, wherein at least one dynamically changeable interleaving parameter is selected from the group consisting of: {a variable branch number; and a variable register depth}; (B) interleaving the original data stream by using the interleaver having at least one dynamically changeable interleaving parameter, wherein the interleaved data stream propagates through the communication channel, and wherein the interleaver compensates for a change in latency caused by at least one dynamically changeable interleaving parameter; and (C) recovering the original data stream from the interleaved data stream propagated through the communication channel by using the de-interleaver adapted to communicate with the communication channel, wherein the de-interleaver includes at least one dynamically changeable interleaving parameter, and wherein the de-interleaver compensates for a change in latency caused by at least one dynamically changeable interleaving parameter.

In one embodiment of the present invention, the step (A) further comprises: (A1) synchronously changing at least one dynamically changeable interleaving parameter at both ends of the communication channel according to the key-algorithm included in the key.

In one embodiment of the present invention, the step (A1) further comprises: (A1, 1) using a Pseudo-Random Binary sequence (PRBS) generator to generate a PRBS key.

In one embodiment of the present invention, the step (B) further comprises: (B1) using an anticipator block in the interleaver to compensate for latency decrease caused by at least one dynamically changeable interleaving parameter.

In one embodiment of the present invention, the step (B) further comprises: (B2) using a compensator block in the interleaver to compensate for latency increase caused by at least one dynamically changeable interleaving parameter.

In one embodiment of the present invention, the step (C) further comprises: (C1) using an anticipator block in the de-interleaver to compensate for latency decrease caused by at least one dynamically changeable interleaving parameter.

In one embodiment of the present invention, the step (C) further comprises: (C2) using a compensator block in the de-interleaver to compensate for latency increase caused by at least one dynamically changeable interleaving parameter.

Another aspect of the present invention is directed to an apparatus for encrypting and decrypting an original data stream.

In one embodiment, the apparatus of the present invention for encrypting and decrypting an original data stream comprises: (A) a key including a key-algorithm configured to describe an evolution in time of at least one interleaving parameter; (B) an interleaver having at least one dynamically changeable interleaving parameter; and (C) a de-interleaver adapted to communicate with the communication channel.

In this embodiment of the present invention, at least one interleaving parameter is being dynamically changed during data transmission through a communication channel according to the key-algorithm. In this embodiment of the present invention, at least one dynamically changeable interleaving parameter is selected from the group consisting of: {a variable branch number; and a variable register depth}, wherein the variable branch number is a first interleaving parameter being dynamically changed during data transmission through the communication channel, and wherein the variable register depth is a second interleaving parameter being dynamically changed during data transmission through the communication channel. In this embodiment of the present invention, the interleaver is configured to interleave the original data stream, and wherein the interleaved data stream propagates through the communication channel. In this embodiment of the present invention, the interleaver compensates for a change in latency caused by changes in each dynamically changeable interleaving parameter. In this embodiment of the present invention, the de-interleaver is configured to recover the original stream of data. In this embodiment of the present invention, the de-interleaver compensates for a change in latency caused by at least one dynamically changeable interleaving parameter.

In one embodiment of the present invention, the key further comprises: a Pseudo-Random Binary sequence (PRBS) generator configured to generate a PRBS key.

In one embodiment of the present invention, the interleaver further comprises: an anticipator block configured to compensate for latency decrease caused by at least one dynamically changeable interleaving parameter.

In one embodiment of the present invention, the interleaver further comprises: a compensator block configured to compensate for latency increase caused by at least one dynamically changeable interleaving parameter.

In one embodiment of the present invention, the de-interleaver further comprises: an anticipator block configured to compensate for latency decrease caused by at least one dynamically changeable interleaving parameter.

In one embodiment of the present invention, the de-interleaver further comprises: a compensator block configured to compensate for latency increase caused by at least one dynamically changeable interleaving parameter.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings.

FIG. 8 illustrates the transition block including p sequential bytes for n=m−1, m=4, n=3, p=[0, 1, 2, 3, 4, 5,].

FIG. 9 depicts how to perform the $F_y(X)$ permutation operation on the transition block of FIG. 8 for m=4, n=3.

FIG. 10 illustrates how to perform the $F_y(X)$ permutation operation on the transition block for m=5, n=4.

DETAILED DESCRIPTION OF THE PREFERRED AND ALTERNATIVE EMBODIMENTS.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
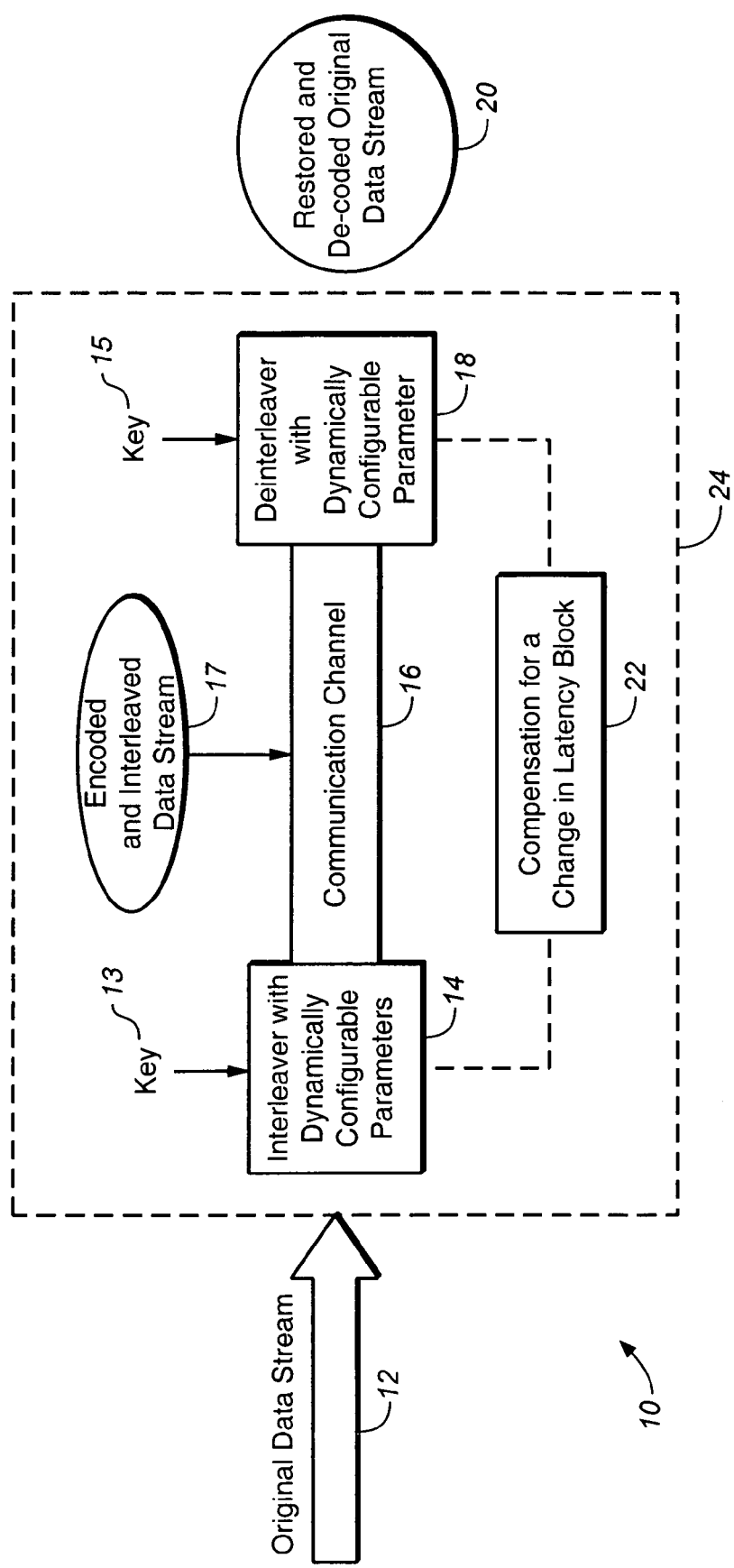
FIG. 1 depicts the basic block diagram of the dynamically configurable interleaver/de-interleaver apparatus of the present invention for data transmission, encrypting and decrypting, including the key, wherein the key includes a key-algorithm configured to describe an evolution in time of at least one interleaving parameter.

In one embodiment, FIG. 1 depicts the basic block-diagram of the dynamically configurable interleaver/de-interleaver apparatus of the present invention 24 for data transmission, encrypting, and decrypting comprising: an interleaver 14 adapted to communicate with a communication channel 16 and to interleave the original data stream by use of at least one dynamically configurable interleaving parameter; a de-interleaver 18 configured to recover the original data stream 12 from the interleaved data stream 17 propagated through the communication channel 16 by use of at least one dynamically configurable interleaving parameter; and a block 22 that illustrates means configured to compensate for a change in latency in the dynamically configurable interleaver/de-interleaver apparatus 24 caused by change in at least one dynamically configurable interleaving parameter. In this embodiment of the present invention, at least one interleaving parameter is being dynamically changed during data transmission through a communication channel according to a key-algorithm included in the key 13 (and/or 15).

In this embodiment of the present invention, at least one dynamically changeable interleaving parameter is selected from the group consisting of: {a variable branch number; and a variable register depth}, wherein the variable branch number is a first interleaving parameter being dynamically changed during data transmission through the communication channel 16, and wherein the variable register depth is a second interleaving parameter being dynamically changed during data transmission through the communication channel 16.

In one embodiment of the present invention, the key 13 (and/or 15) further comprises a Pseudo-Random Binary sequence (PRBS) generator configured to generate a PRBS key. Please, see the discussion below.

Referring still to FIG. 1, the interleaver 14 and/or de-interleaver 18 can be implemented in a number of ways. Typically the implementation involves a memory (such as a random access memory, RAM) and an address (pointer) generator. In one common embodiment, a single pointer is used. At the address indicated by the pointer, data is read, and then new data is written (at the same address). The pointer is then advanced, according to an implementation algorithm that effectively implements the interleaver/de-interleaver structure. In an alternative embodiment, two pointers are used, one pointing to a read address and another pointing to a write address. Again, the pointers are advanced according to the implementation algorithm that implements the desired behavior, but the read pointer, for example, can be ahead of the write pointer, allowing simultaneous read and write operations (rather than a read followed by a write, as in the single pointer apparatus). This embodiment may have some advantage in certain apparatuses. For example, the 2-pointer apparatus can make use of a dual-port memory, wherein a read operation and a write operation can be performed simultaneously. This allows operation at twice the speed of a comparable single-pointer apparatus.

In one embodiment of the present invention, a means configured to compensate for the change in latency in the dynamically configurable interleaver/de-interleaver apparatus 24 caused by change in at least one dynamically configurable interleaving parameter is further configured to allow a constant stream of data to propagate through the communication channel 16 without a data deletion, without a data re-ordering, and without addition of a spurious data, and wherein an input and an output data rates are allowed to undergo transient independent fluctuations (please, see discussion below).

In a number of prior art data transmission systems (for instance, in a data transmission system that utilizes a Rayleigh fading channel), the errors occur in bursts rather than at random. In a burst-error situation the occurrence of a bit in error means that the likelihood of the next bit being also in error is increased. A rare burst of errors can cause output errors even though the overall probability of bit error is low. This stands in contrast to random errors, which are independent of one another and are modeled by the Binary Symmetric Channel (BSC).

Interleaving is a technique commonly used in communication apparatuses to overcome correlated channel noise such as burst error or fading. The interleaver rearranges input data such that consecutive data are split among different blocks. At the receiver end, the interleaved data is arranged back into the original sequence by the de-interleaver. As a result of interleaving, correlated noise introduced in the transmission channel appears to be statistically independent at the receiver and thus allows better error correction.

Figure 2:
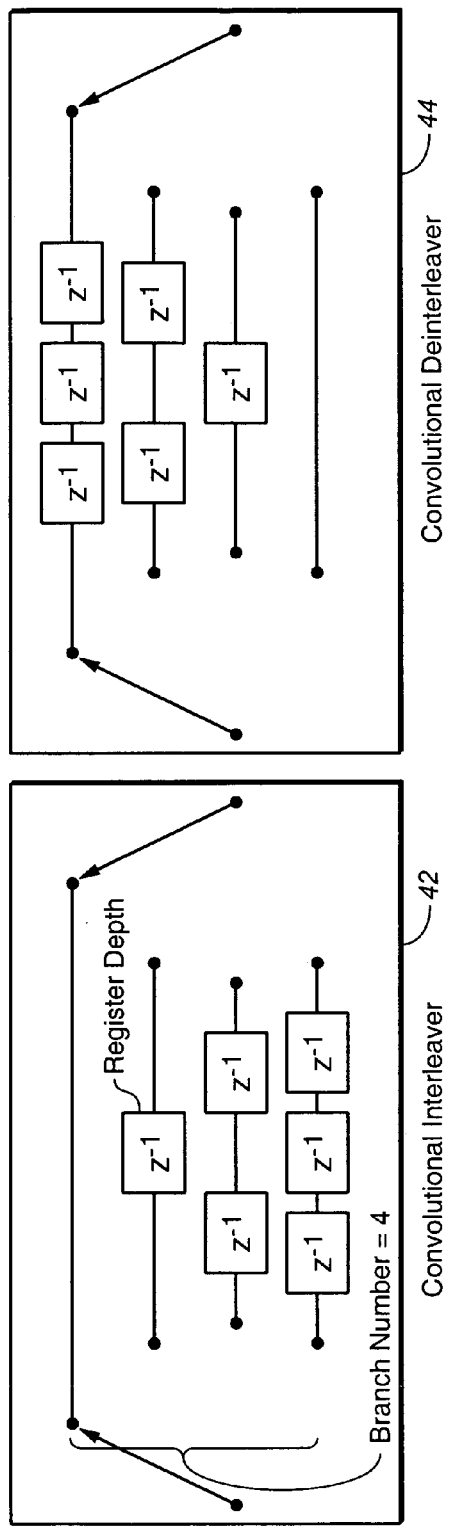
FIG. 2 illustrates the operation of a prior art convolutional interleaver/de-interleaver apparatus.

FIG. 2 illustrates the operation of a prior art convolutional interleaver/ de-interleaver apparatus 40. Conceptually the interleaver 42 and de-interleaver 44 are implemented by shift registers of sequential length, and write and read pointers locked in step with one another. Two parameters define such an apparatus, the branch number, and the register depth. The branch is simply the number of shift register lines (4 in the example above), and the register depth is the number of delays introduced by each register unit. Both values are only constrained by implementation considerations.

The pointers in the de-interleaver in such an apparatus should be synchronized with the de-interleaver input data stream, so that each incoming byte is assigned to the appropriate branch of shift registers in the de-interleaver. Upon output from the de-interleaver the data is restored to its original order, with an introduced latency equal to the branch number times the register depth.

Figure 3:
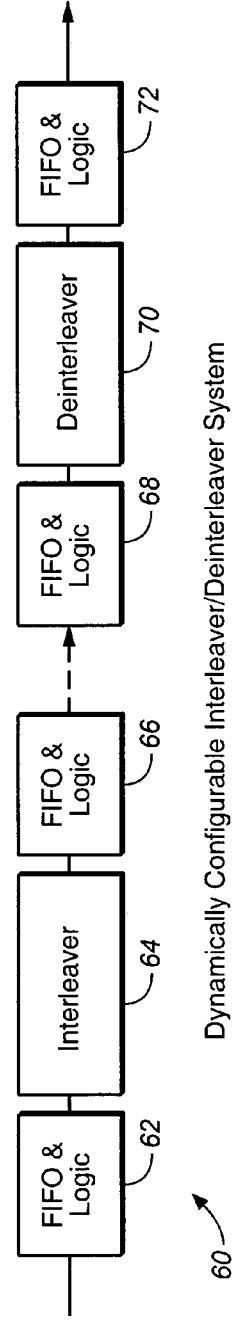
FIG. 3 shows the dynamically configurable interleaver/de-interleaver apparatus of the present invention that adds encryption to the data stream according to a Pseudo-Random Binary sequence (PRBS) key, wherein the changes in latency are compensated by means of FIFOs (and logic) at the input and output of both the interleaver and de-interleaver.

In one embodiment of the apparatus 60 of the present invention, depicted in FIG. 3, the branch value and the register depth value can be dynamically changed, during the data stream, according to the key-algorithm included in the key (13 and/or 15 of FIG. 1).

In one embodiment of the present invention, the means configured to compensate for the change in latency in the dynamically configurable interleaver/de-interleaver apparatus caused by change in at least one dynamically configurable interleaving parameter further includes a means for adding and/or dropping clocks at the receiving end of the apparatus, but without use of FIFOs (and logic).

Referring still to FIG. 3, in one embodiment of the present invention, the means configured to compensate for the change in latency in the dynamically configurable interleaver/de-interleaver apparatus caused by change in at least one dynamically configurable interleaving parameter (22 of FIG. 1) further includes a means for data buffering implemented by using FIFOs and some logic (62, 66, 68 and 72) at the input and output of both the interleaver 64 and de-interleaver 70.

When a parameter change implies an increase in overall latency (let's call this scenario case A) the added latency will be absorbed by the output FIFOs (and output logic), and the meaningless output bytes (those that contribute this latency) will be sorted out and dropped from the data stream. The interleaver and de-interleaver will contribute half of the additional latency each.

On the other hand, when a parameter change that implies a decrease in overall latency (let's call this scenario case B) is pending; control logic will anticipate and prepare the interleaver input stream for transmission by inserting dummy bytes. These dummy bytes will be injected into the data stream at the interleaver (or de-interleaver) input in pre-defined locations in such a way that when the interleaver and de-interleaver parameters change to their new reduced values, the registers which are dropped from the write/read sequence are only occupied by dummy bytes, which are lost at no cost. This insertion of dummy bytes is purely conceptual. The dummy bytes do not need to be transmitted as they can be 'reinserted' at the input to the de-interleaver.

The preparation of the input stream to the interleaver in the increasing-latency scenario case, (case A) and the corresponding sorting of the output stream of the de-interleaver in the decreasing-latency scenario case (scenario B) are logically equivalent. More specifically, the points at which sacrificial dummy bytes should be inserted in the input stream in scenario case B correspond to the locations of the meaningless bytes in the output stream in scenario case A.

Let's first look at scenario case B, the decreasing-latency case. Let us assume the initial interleaver branch number m, and the next branch number, the number changed to, n. Thus, in the scenario B -decreasing-latency case, the initial interleaver branch number m is changed to n:m→n, where n<m.

Figure 4:
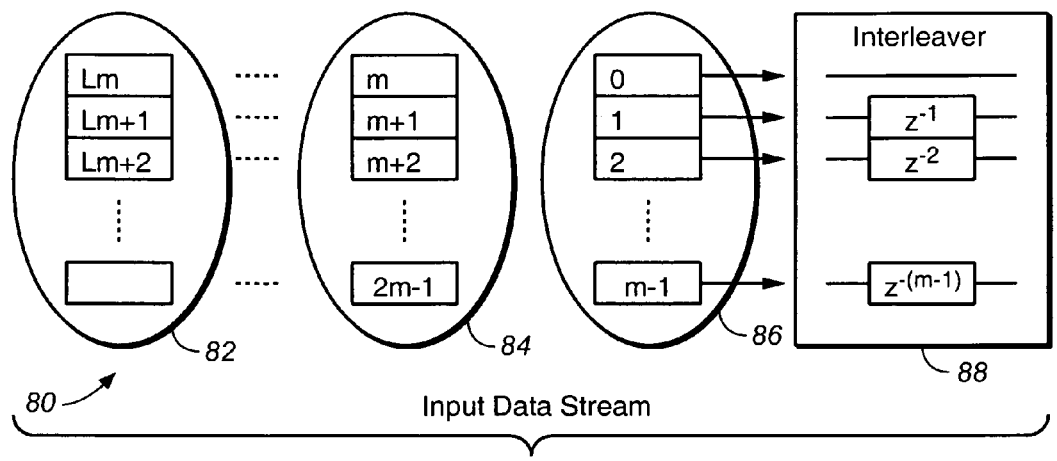
FIG. 4 illustrates a prior art technique of preparation the input data stream for subsequent interleaving procedure.

In one embodiment of the present invention, FIG. 4 illustrates a prior art technique for preparation of the input data stream for subsequent interleaving procedure.

In this embodiment of the present invention, if we consider the data lined up for interleaving in consecutive columns 82-84 . . . -86, each column will have m rows, each row corresponding to one branch of the interleaver 88. Immediately preceding the change in the interleaver from m to n, m−1 column of data should be prepared with dummy byte insertion, and valid byte rearrangement, so that at the point of reduction in interleaver size, the discarded bytes (those occupying the discarded registers) are all dummy bytes, and no interruption in transmission stream occurs.

The change in the interleaver branch number parameter m→n, where n<m, affects the de-interleaver also, Thus, the arrangement of the interleaver input stream should take this into account. In one embodiment of the present invention, this is done by insertion a plurality of sacrificial dummy bytes at the interleaver input, half of which will perish during the interleaver reduction, and the other half will perish in the de-interleaver.

Figure 5:
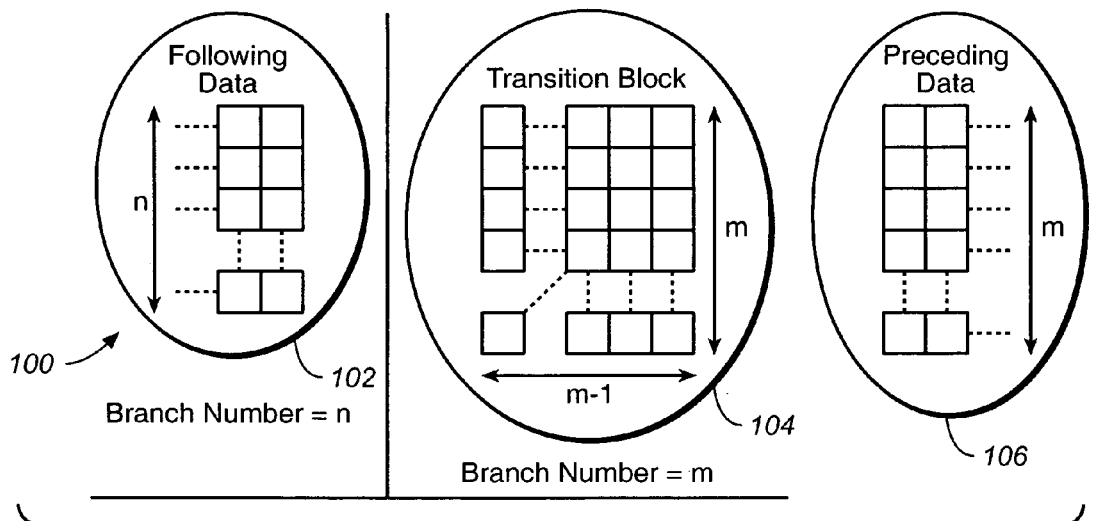
FIG. 5 depicts the complete block of data comprising the preceding data block, the transition data block, and the following data block, that is employed by the dynamically configurable interleaver/de-interleaver apparatus of FIG. 3 of the present invention to vary the input stream of data.

In one embodiment of the present invention, FIG. 5 illustrates how the dynamically configurable interleaver/de-interleaver apparatus 60 of FIG. 3 varies the input stream of data. More specifically, the data block 106 preceding the transition data block 104 is input exactly as it would be input for a static interleaver/de-interleaver apparatus of branch number m. Similarly, the block of data 102 following the transition data block 104 is also input exactly as it would be the case for a static interleaver/de-interleaver apparatus of branch number n. However, the complete input data block 100 (comprising the preceding data block 106, the transition data block 104, and the following data block 102) entering the dynamically configurable interleaver/de-interleaver apparatus 60 of FIG. 3 of the present invention is different as compared with the static version of the data stream entering the prior art interleaver/de-interleaver apparatus 40 of FIG. 2 precisely because the branch number of the interleaver changes from m to n in the present invention.

Figure 6:
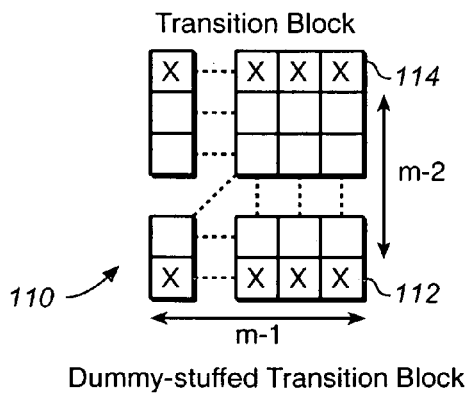
FIG. 6 illustrates the transition data block employed by the apparatus of the present invention that implements the change from the input data entering the static interleaver having the branch number m to the input data entering the static interleaver having the branch number n, where m>n.

Let us focus our discussion on the transition block 110 of FIG. 6 that implements the change from the input data entering the static interleaver having the branch number m to the input data entering the static interleaver having the branch number n>m.

In one embodiment of the present invention, the transition block 110 of FIG. 6 includes (n−1)*n data bytes and a number of dummy bytes $N_{dummy}$.

$$N_{dummy} = [(m-1)*m] - [(n-1)*n]. \qquad \text{(Eq. 1)}$$

Note that for m=n this formula reduces to a trivial solution. The first 112 and last 114 rows of the transition block are made up entirely of dummy bytes (indicated by the letter 'X'). This is because the simplest reduction in branch number, i.e. a reduction of 1, will eliminate the length (m−1) branch (the longest branch) from both the interleaver and de-interleaver. In this case these two rows would provide the number of dummy bytes $N_{dummy} = [(m-1)*m] - [(n-1)*n]$ dummy bytes according to (Eq. 1). By substituting n by (m−1), Eq. 1 can be rewritten as follows:

$$N_{dummy} = (m-1)*m - (n-1)*n = \{\text{substituting } n=m-1\}$$

$$(m-1)*m - ((m-1)-1)*(m-1) =$$

$$(m-1)*m - (m-2)*(m-1) =$$

$$(m-1)(m-m+2) \qquad \text{(Eq. 2)}$$

The remaining (n−1)*n data bytes in the transition block should be rearranged so that they re-attain their intended order at the output of the de-interleaver. In the case n=m−1, one can define this order, as it is fully explained below.

Indeed, let us consider the transition block 110 of FIG. 6 with the top 114 and bottom 112 rows removed. We now have a block of m−1 columns, each m−2 in length. We have previously shown that in the case n=m−1, all of these remaining (m−1)*(m−2) data bytes should be valid data bytes, and contain no dummy bytes (this is necessary to satisfy Eq. 2).

Figure 7:
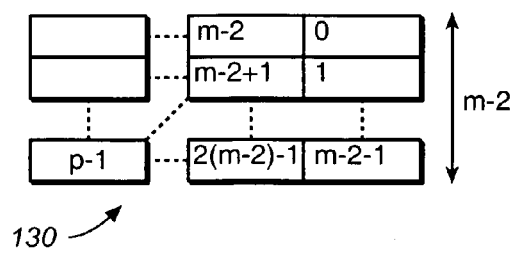
FIG. 7 shows the re-indexed transition block of FIG. 6 including p sequential bytes and arranged in the (m−1)*(m−2) array, where index p=(m−1)*(m−2).

Given there are now (m−1)*(m−2) data bytes in the transition block 110 of FIG. 6, let us index them with the set P=[0,1,2, . . . ,p−1] where p=(m−1)*(m−2) The p sequential bytes can be arranged in the (m−1)*(m−2) array 130 as shown in FIG. 7. For example, if m=4, and n=3, FIG. 8 illustrates the transition block 140 including p sequential bytes for n=m−1, m=4, n=3, p=[0,1,2,3,4,5,].

Let us consider the permutation operation $F_y(X)$ where the first member of a finite set is moved to the last position y times.

Example for: y=4:

$$F_0(0, 1, 2, 3) = [0, 1, 2, 3]$$

$$F_1(0, 1, 2, 3) = [1, 2, 3, 0]$$

$$F_2(0, 1, 2, 3) = [2, 3, 0, 1]$$

$$F_3(0, 1, 2, 3) = [3, 0, 1, 2] \qquad \text{(Eq. 3)}$$

To optimize the transmission of data, one can rearrange the columns of the transmission block by performing the permutation $F_y(X)$ on the columns of the transition block, where y corresponds to the column number index: y runs from 0 to m−1. The set size is given by m−2, so the first and last column always remain unchanged, with each column in the transition block undergoing one more permutation iteration than the column to its right. FIG. 9 illustrates how to perform the $F_y(X)$ permutation operation on the transition block 140 of FIG. 8 for m=4, n=3. FIG. 10 depicts how to perform the $F_y(X)$ permutation operation on the transition block for m=5, n=4.

The transition block includes (n−1)*n bytes according to Eq. 1, and the larger changes in branch number will introduce only more dummy bytes as the transition block valid bytes are now well-defined.

Figures 11, 12, 13A, 13B:
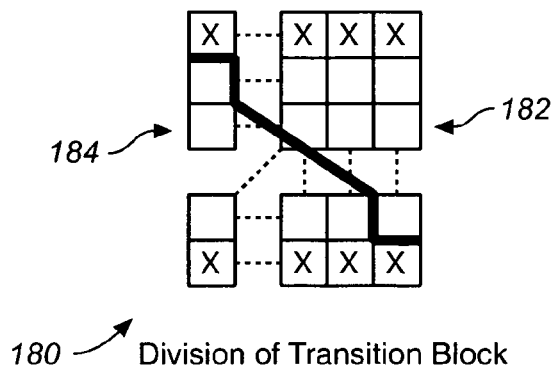
FIG. 11 shows the division of the valid-byte section of the transition block in two blocks.
FIG. 12 depicts the division of the valid-byte section of the transition block in two blocks for m=4, n=3.
FIG. 13A illustrates the division of the valid-byte section of the transition block in two blocks for m=5, n=4.
FIG. 13B shows the division of the valid-byte section of the transition block in two blocks for m=8, n=4.

However, there is still a way to achieve a further reduction in the branch number. Indeed, as shown in FIG. 11, one can consider splitting the valid-byte section of the transition block 180 (the transition block minus the top and bottom rows of dummy bytes) for n=m−1 in two. We divide it into an upper-right half 182, and a lower left half 184, with the horizontal orientation of any unit having precedence over its vertical placement. FIG. 12 depicts the division of the valid-byte section of the transition block 190 in two blocks for m=4, n=3. FIG. 13A illustrates the division of the valid-byte section of the transition block 200 in two blocks for m=5, n=4. As the transition block size increases with increasing m, these two chunks of the transition block an upper-right half, and a lower-left half, remain in the same positions in the transition block. The left half always remains in the same position relative to the top left of the transition block, and the right remains in the same position with respect to the bottom right of the block, if m≈n. The remaining transition block vacancies are filled by dummy bytes.

FIG. 13B shows the division of the valid-byte section of the transition block 210 in two blocks for m=8, n=4. In this situation, m>>n, and the left half becomes the upper-left half, and the right half becomes the lower-right half.

The data stream is now read into the interleaver according to this rearrangement, after which, normal sequential input is resumed with the newly reduced branch number interleaver.

Thus, the input data rearranged according to the algorithm outlined above will arrive at the output of the de-interleaver in its originally intended order. The dummy bytes inserted at the interleaver will have disappeared; having been sacrificially loaded into that interleaver registers which were dynamically removed. No further operations on the data will be necessary at the de-interleaver output.

Figure 14:
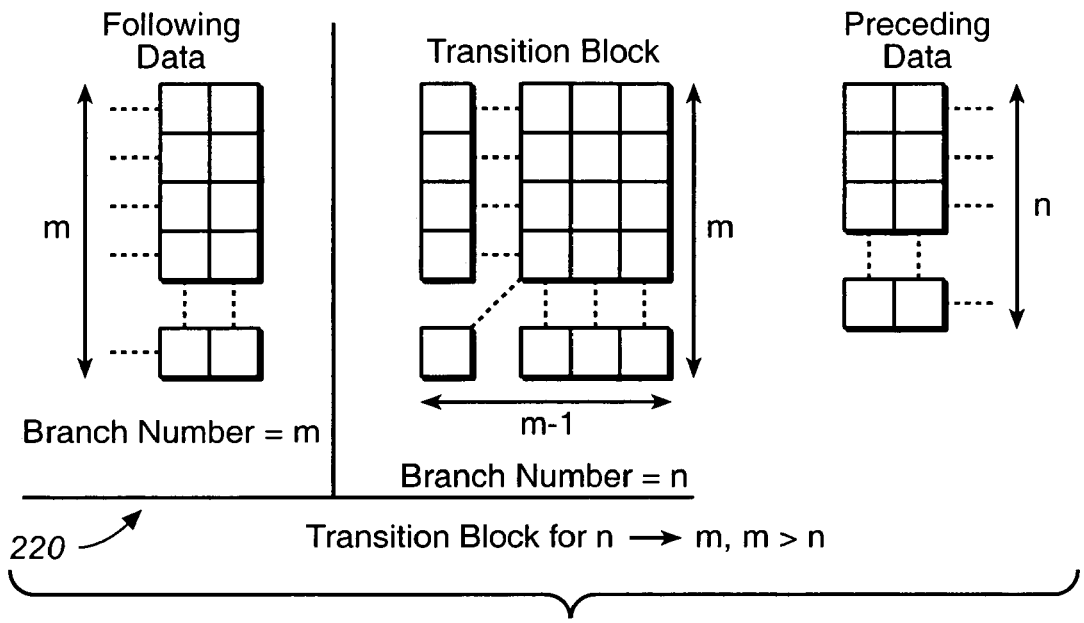
FIG. 14 depicts the data rearrangement for Scenario A—increase latency case, wherein m>n.

The same algorithm in reverse may be used to sort data at the de-interleaver output in the Scenario A-increase latency case, wherein m>n, as shown in FIG. 14. If this is the case, an increase in branch number is dynamically introduced. At the output of the de-interleaver, bytes corresponding to the dummy byte positions may be ignored, and bytes corresponding to the valid byte positions may be rearranged back to their intended sequence. The transition block is exactly the same, also defined by the larger of the two branch values.

In one embodiment of the present invention, the dynamically changeable interleaver parameter is a register depth, conceptually being the number of delays introduced at each delay unit on each branch of the interleaver. The effect of the register depth's change on the transition block is simply a linear expansion of the dummy and valid byte pattern. There is a notation difference depending on how the extra registers are inserted, either before the existing registers in the data stream, or after. Either case is implementable.

Figure 15:
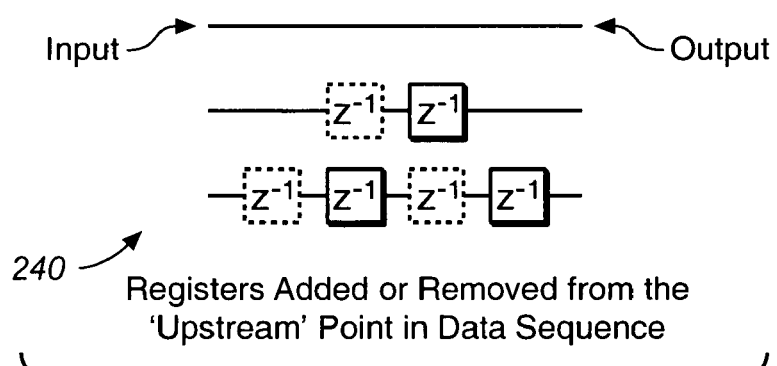
FIG. 15 illustrates an example when the register depth of an interleaver becomes a dynamically configurable interleaver parameter, whereas the registers are added or removed from the 'upstream' point in data sequence.

In an example when a register depth of an interleaver becomes a dynamically configurable interleaver parameter, as depicted in diagram 240 of FIG. 15, the registers are added or removed from the 'upstream' point in data sequence.

In one embodiment of the present invention, for a register depth reduction p→q, q<p, the transition block should be inserted into the input stream to the interleaver, to provide the necessary sacrificial data entries to accommodate the reduction in latency of the apparatus.

For example, let us consider an interleaver/de-interleaver scheme with a constant branch number, m. If this is the case, the transition block should be inserted into the data stream before the change in register depth is implemented. In other words, the register depth parameter is changed upon input of the last transition block data unit entering the interleaver.

As with the branch number transition block, the register depth transition block pattern may be used at the output of the de-interleaver in the increasing register depth case, to discern which data to ignore.

Figure 16:
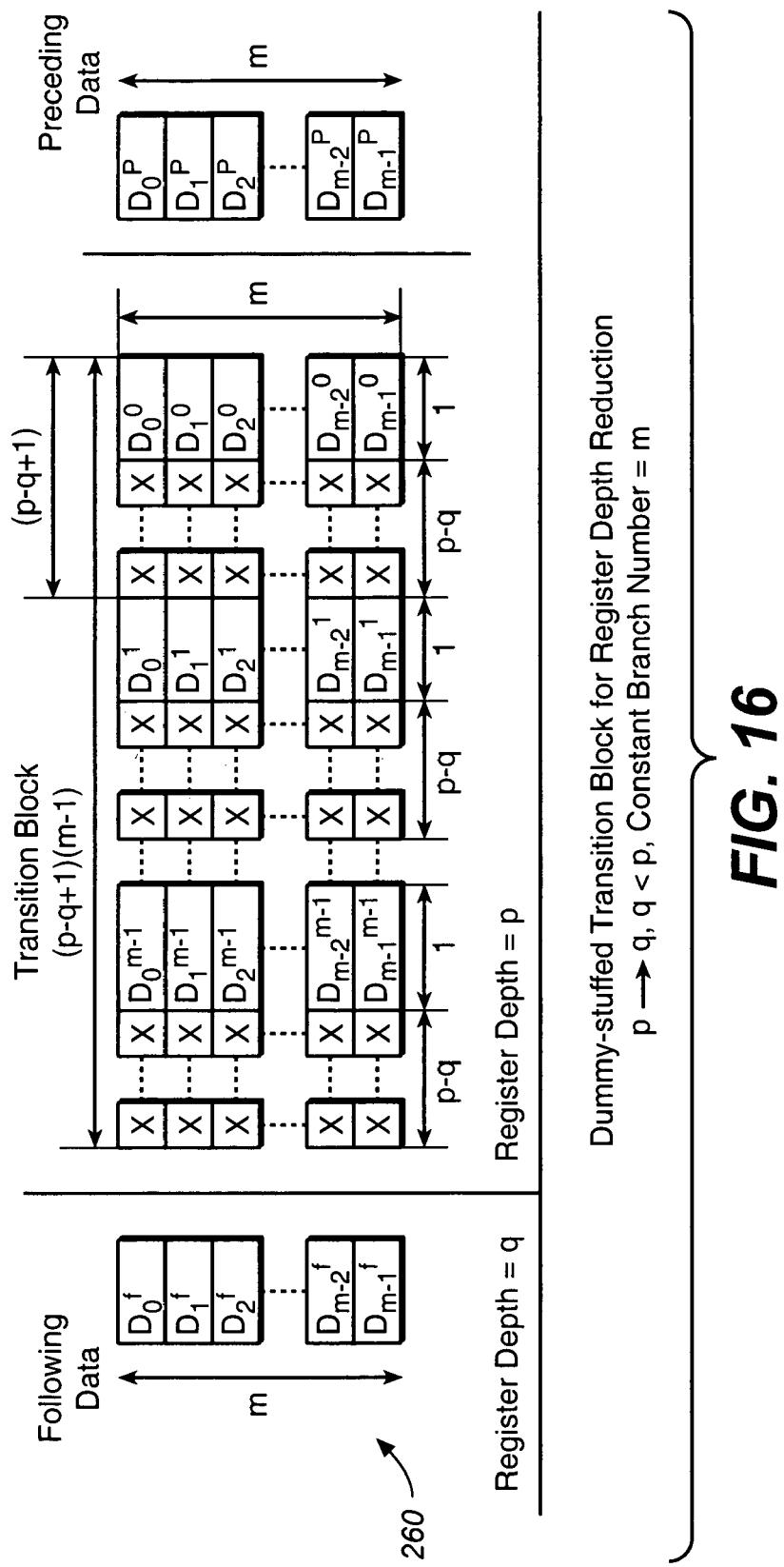
FIG. 16 shows the dummy-stuffed transition block for register depth reduction p→q, q<p, whereas the branch number is constant: m=constant.

In the case of register depth changes, no re-ordering of data occurs, so the transition algorithm only involves the insertion of dummy bytes in the increasing-depth case, and the deletion of dummy bytes in the reducing-depth case. Again, as with the change in branch, dummy bytes are conceptual and do not need to be transmitted via the transmission channel. FIG. 16 illustrates the dummy-stuffed transition block for register depth reduction p→q, q<p, whereas the branch number is constant: m=constant.

In one embodiment of the present invention, one would consider a compound case, whereas both branch and depth changes concurrently occur. If this is the case, the apparatus transitions described above allow added complexity in the ordering of data transmission. The four variables dictating the above transitions are shown in Table 1.

TABLE 1

Independent system variables.

| Description | Variable |
| --- | --- |
| New Branch Value | X |
| Position in data stream of Branch Value Change | $T_x$ |
| New Depth Value | Y |
| Position in data stream of Depth Value Change | $T_y$ |

The linearity of the operations required to generate both types of transition block means that concurrent, and non-concurrent-but-overlapping, transitions can occur and are simple to implement. However, a change in register depth always requires the insertion of (m−1) sets of (p−q) columns, of length m, after every valid column of the transition block.

Figure 17A:
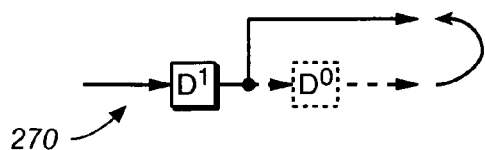
FIG. 17A depicts a mechanism whereby the data is lost in a decrease latency scenario case.
Figure 17B:
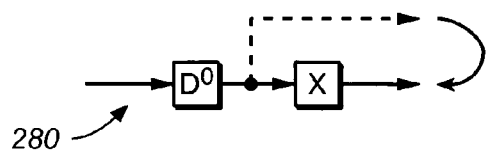
FIG. 17B illustrates a mechanism whereby a spurious data is introduced in an increase latency scenario case.

Referring still to FIG. 1, the block 22 is used to compensate for change in latency of the apparatus of the present invention 24 brought about by dynamic changes in interleaver parameter. In the case of a dynamic (mid data flow) decrease in latency the data loss is inevitable. As a result the logic before the interleaver (270 of FIG. 17A) should anticipate this data loss and insert sacrificial data into the data stream. On the other hand, in the case of a dynamic (mid data flow) increase in latency, the introduction of spurious data, and reading a register that has not yet been written, is inevitable. As a result the logic after the interleaver (280 of FIG. 17B) should compensate for this data and delete it.

Figure 17C:
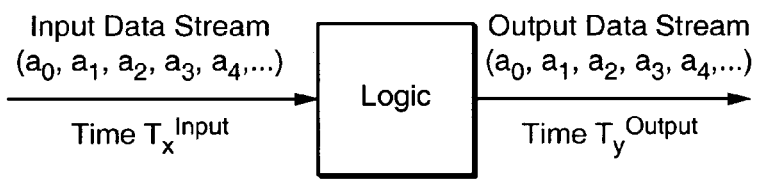
FIG. 17C depicts a prior art generalized data stream buffer.

Referring still to FIG. 1, in one embodiment of the present invention, the means configured to compensate for the change in latency 22 in the dynamically configurable interleaver/de-interleaver apparatus caused by change in at least one dynamically configurable interleaving parameter further includes a means for data buffering. FIG. 17C depicts a generalized data stream buffer 290. In general, a data buffer is a logic block which may or may not include a memory element which allows a constant stream of data, either in parallel or serially, to propagate without deletion, without re-ordering and without the addition of spurious data, with the input and output rates allowed to undergo transient independent fluctuations. The data buffering is implemented by using at least one FIFO and some logic. A FIFO is an example of a general purpose data buffer.

Referring still to FIG. 3, in one embodiment of the present invention, the input FIFO (and at least one input logic) 62 coupled to an input of the interleaver 64 is configured to compensate for the change in latency in the dynamically configurable interleaver/de-interleaver apparatus 60 caused by change in at least one dynamically configurable interleaving parameter. In another embodiment of the present invention, the output FIFO (and at least one output logic) 66 coupled to an output of the interleaver 64 is configured to compensate for the change in latency in the dynamically configurable interleaver/de-interleaver apparatus 60 caused by change in at least one dynamically configurable interleaving parameter. In one more embodiment of the present invention, the input FIFO (and at least one input logic) 68 coupled to an input of the de-interleaver 70 is configured to compensate for the change in latency in the dynamically configurable interleaver/de-interleaver apparatus 60 caused by change in at least one dynamically configurable interleaving parameter. In an additional embodiment of the present invention, the output FIFO (and at least one output logic) 72 coupled to an output of the de-interleaver 70 is configured to compensate for the change in latency in the dynamically configurable interleaver/de-interleaver apparatus 60 caused by change in at least one dynamically configurable interleaving parameter.

Referring still to FIG. 1, in one embodiment of the present invention, the means configured to compensate for the change in latency 22 in the dynamically configurable interleaver/de-interleaver apparatus caused by change in at least one dynamically configurable interleaving parameter further includes a means for adding and/or dropping clocks at the receiving end of the apparatus.

Figure 18A:
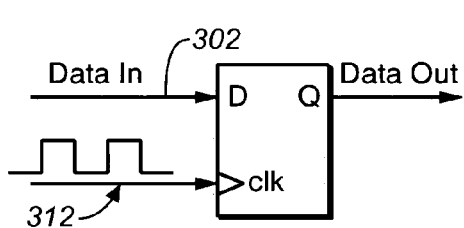
FIG. 18A shows a prior art whereby the input to a register is loaded on every clock edge.
Figure 18B:
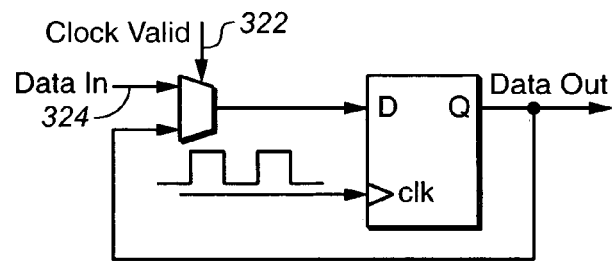
FIG. 18B illustrates a prior art technique to control data-throughput rates via a clock validation (clock dropping).

In a digital design, a common prior art technique to control data—throughput rates is a clock validation, whereby instead of the input 302 to a register being loaded on every clock edge 312 as shown in a diagram 300 of FIG. 18A, the data propagation 324 is further controlled by a clock-valid signal 322 as shown in a diagram 320 of FIG. 18B. If every register in a design is implemented with a clock validation, the operational rate of the design can be controlled via clock validation.

Figure 19A:
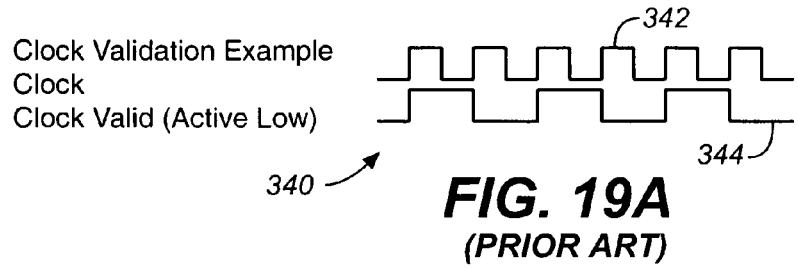
FIG. 19A depicts the waveforms for the clock validation techniques shown in FIG. 18B (clock dropping).
Figure 19B:
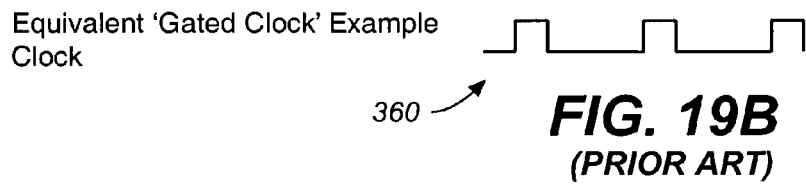
FIG. 19B illustrates the waveform for the equivalent prior art 'gated clock' example (clock dropping).

Another equivalent technique is the alteration of the clock signal itself, to achieve the same result. This is called 'gating the clock'. FIG. 19A depicts the waveforms 342 and 344 for the clock validation techniques shown in FIG. 18B, whereas FIG. 19B illustrates the waveform 360 for the equivalent prior art 'gated clock' example.

Either of these techniques (clock validation or clock gating) may be regarded as 'clock dropping' and allow data rates to be reduced in a controlled manner, to any rate less than the actual clock rate.

Either of these techniques (clock validation or clock gating) can be also modified to ignore data. If an earlier register in the data-flow is not clock validated, it will update at every clock. By controlling the clock validation into the next register, certain data may be ignored. Thus, either of these techniques (clock validation or clock gating) could be used in the dynamically configurable interleaver/de-interleaver design to ignore dummy bytes that have been generated as a result of latency increase, or to insert dummy bytes into data stream to anticipate latency decrease.

Figure 20:
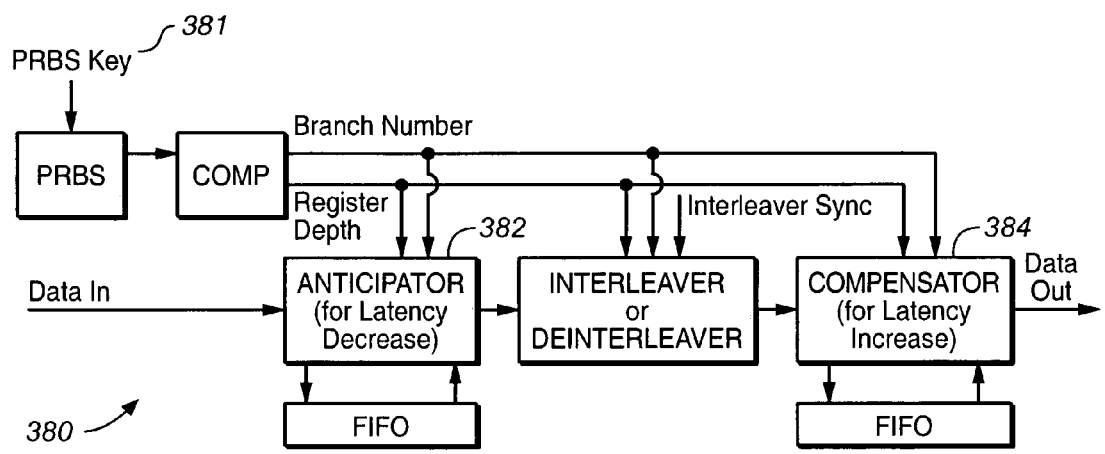
FIG. 20 depicts a generalized diagram of a dynamically configurable interleaver/de-interleaver apparatus of the present invention including an anticipator configured to anticipate latency decrease and a compensator configured to compensate for latency increase.

In one embodiment of the present invention, FIG. 20 depicts a generalized diagram of a dynamically configurable interleaver/de-interleaver apparatus of the present invention 380 including a key including a key-algorithm 381, an anticipator 382 configured to anticipate latency decrease, and a compensator 384 configured to compensate for latency increase. For the proposed system to work the parameter changes must correspond in both the interleaver and de-interleaver In one embodiment of the present invention, wherein only initial synching is required, as shown in diagram 390 of FIG. 20A, the matching Pseudo Random Binary Sequence (PRBS) generators 392 in both the encoder and decoder components are used. Once initialized, the n-bit PRBS 392 will output every unique n-bit value 393, spanning the set $[1, 2^n-1]$ in a pseudo random and deterministic order. The length of the sequence is determined by the value of n, and extremely long sequences are not difficult to generate.

The initialization and use of PRB Sequences is well known in the art. The same initialization signal which serves as a reference point for the interleaver may be used to initialize the PRBS.

In one example, the output 393 of the PRBS 392 is fed to a comparator module 394, which scans the PRBS sequence for key words, which it uses to trigger the interleaver/de-interleaver parameter changes. This way, the parameter values, and the time of their change, may be randomly assigned throughout the (PRB) Sequence. Also, by this means, the exact same parameter changes may be enacted in both the encoder and decoder, and corresponding interleaver and de-interleaver.

In another embodiment of the present invention, the PRBS generator 392 could be replaced by a simple n-bit sequential counter (not shown), which will also span every unique n-bit value.

Yet, in another embodiment of the present invention, the synchronized changes in interleaver parameters are implemented by transmission of the configuration parameters across the communication channel, either in pre-determined data positions (such as at set intervals) or preceded by a fixed data sequence which would alert the receiver to the following parameter transmission.

FIGS. 21A-21D depict the various embodiments of the present invention configured to implement the means for data buffering configured to compensate for change in latency. In the case of a dynamic (mid data flow) decrease in latency data loss is inevitable. As a result the logic before the interleaver must anticipate this data loss and insert sacrificial data into the data stream. In the case of a dynamic (mid data flow) increase in latency the introduction of spurious data, reading a register that has not yet been written, is inevitable. As a result the logic after the interleaver must compensate for this data and delete it.

Figure 21A:
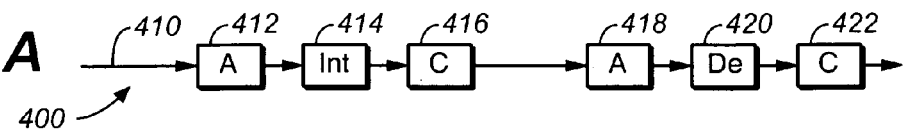
FIGS. 21A-21D shows various embodiments of the present invention configured to implement the means for data buffering configured to compensate for change in latency.

In one embodiment of the present invention, FIG. 21A shows the means for data buffering 410 further including an interleaver anticipating means 412 coupled to the input of the interleaver 414 and configured to anticipate a decrease in latency; an interleaver compensating means 416 coupled to the output of the interleaver 414 and configured to compensate for a increase in latency; a de-interleaver anticipating means 418 coupled to the input of the de-interleaver 420 and configured to anticipate the decrease in latency; and a de-interleaver compensating means 422 coupled to the output of the de-interleaver 420 and configured to compensate for the increase in latency.

Figure 21B:
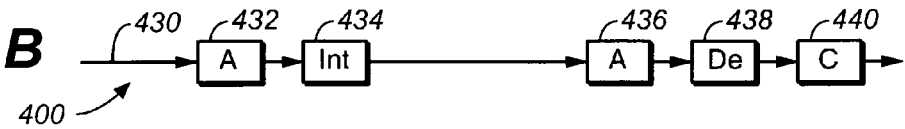

In another embodiment of the present invention, FIG. 21B depicts the means for data buffering 430 further including an interleaver anticipating means 432 coupled to the input of the interleaver 434 and configured to anticipate the decrease in latency; a de-interleaver anticipating means 436 coupled to the input of the 438 de-interleaver and configured to anticipate the decrease in latency; and a de-interleaver compensating means 440 coupled to the output of the de-interleaver 438 and configured to compensate for the increase in latency.

Figure 21C:
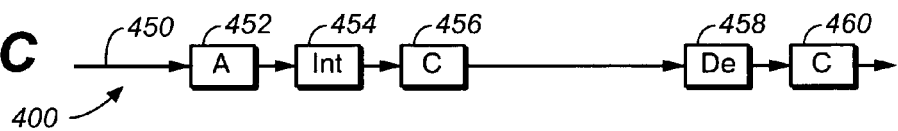

In one more embodiment of the present invention, illustrated in FIG. 21C, the means for data buffering 450 further includes: an interleaver anticipating means 452 coupled to the input of the 454 interleaver and configured to anticipate the decrease in latency; an interleaver compensating means 456 coupled to the output of the interleaver 454 and configured to compensate for the increase in latency; and a de-interleaver compensating means 460 coupled to the output of the de-interleaver 458 and configured to compensate for the increase in latency.

Figure 21D:

In one additional embodiment of the present invention, shown in FIG. 21D, the means for data buffering 470 further includes: an interleaver anticipating means 472 coupled to the input of the 474 interleaver and configured to anticipate the decrease in latency, and a de-interleaver compensating means 478 coupled to the output of the de-interleaver 476 and configured to compensate for the increase in latency.

Figure 22A:
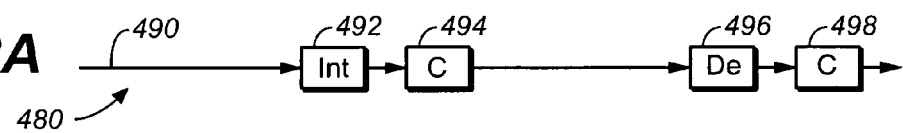
FIGS. 22A-22B illustrate two different techniques to implement the dynamically configurable interleaver/de-interleaver apparatus of the present invention which while in operation results in increase in latency.
Figure 22B:

FIGS. 22A-22B illustrate two different techniques to implement the dynamically configurable interleaver/de-interleaver apparatus of the present invention which while in operation results in increase in latency. In one embodiment of the present invention, the means configured to compensate for the increase in latency in the apparatus further includes a data transition block configured to delete a set of dummy bytes inserted into the data stream. This set of dummy bytes was previously inserted into the data stream as a result of change in at least one configurable parameters that caused the increase in latency in the apparatus.

More specifically, in one embodiment of the present invention, FIG. 22A depicts the means configured to compensate for the increase in latency 490 further including an interleaver compensating means 494 coupled to the output of the interleaver 492, and a de-interleaver compensating means 498 coupled to the output of the de-interleaver 496.

In another embodiment of the present invention, shown in FIG. 22B, the means configured to compensate for the increase in latency further includes a de-interleaver compensating means 506 coupled to the output of the de-interleaver 506.

Figure 23A:
FIGS. 23A-23B depict two different techniques to implement the dynamically configurable interleaver/de-interleaver apparatus of the present invention which while in operation results in decrease in latency.
Figure 23B:

FIGS. 23A-23B illustrate two different techniques to implement the dynamically configurable interleaver/de-interleaver apparatus of the present invention which while in operation results in decrease in latency. In one embodiment of the present invention, the means configured to anticipate the decrease in latency in the apparatus further includes a data transition block configured to insert a set of sacrificial data into the data stream. A change in at least one configurable parameters that caused the decrease in latency in the apparatus results in subsequent deletion of this set of sacrificial data. Please, see the discussion above.

More specifically, in one embodiment of the present invention, FIG. 23A depicts the means 520 configured to anticipate the decrease in latency further including an interleaver anticipating means 522 coupled to the input of the interleaver 524, and a de-interleaver anticipating means 526 coupled to the input of the de-interleaver 528.

In another embodiment of the present invention, shown in FIG. 23B, the means configured to anticipate the decrease in latency 530 further includes an interleaver anticipating means 532 coupled to the input of the interleaver 534.

Another aspect of the present invention is directed to a method for encrypting and decrypting a data stream by using a dynamically configurable interleaver/de-interleaver apparatus 10 of FIG. 1. In one embodiment, the method of the present invention comprises (not shown) the step (A) of transmitting a copy of a key 13 to an interleaver 14, and transmitting a copy of a key 15 to a de-interleaver 18, wherein the interleaver 14 is placed at a transmitting end of a communication channel 16, and wherein the de-interleaver 18 is placed at a receiving end of the communication channel 16, wherein each key includes the same key-algorithm configured to describe an evolution in time of at least one interleaving parameter.

At the next step (B) (not shown) interleaving of the original data stream 12 is performed by using the interleaver 14 having at least one dynamically changeable interleaving parameter, wherein the interleaved data stream propagates through the communication channel, 16 and wherein the interleaver 14 compensates for a change in latency caused by at least one dynamically changeable interleaving parameter. Finally, at the step (C) (not shown) the recovering of the original data stream 12 from the interleaved data stream propagated through the communication channel 16 is performed by using the de-interleaver 18 adapted to communicate with the communication channel 16.

Figure 20A:
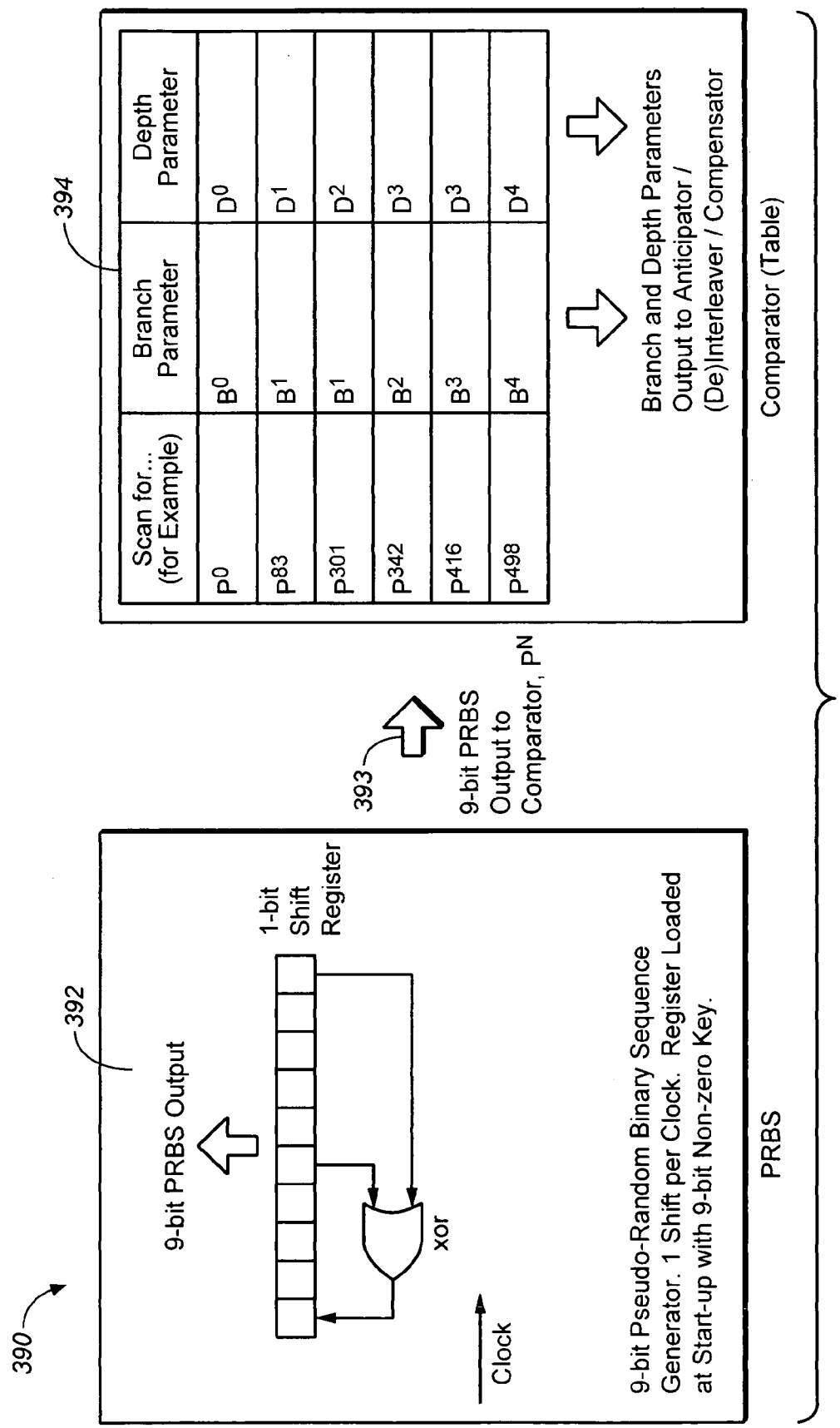
FIG. 20A illustrates one example of PRBS key used to implement sequence of an interleaver parameter changes for the method of the present invention.

In one embodiment of the present invention, the Pseudo-Random Binary sequence (PRBS) generator 392 is used to generate a PRBS key, as shown in FIG. 20A.

The foregoing description of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. Therefore, it is intended that the scope of the invention be defined by the claims appended hereto and their equivalents, rather than by the foregoing description. All changes which come within the meaning and range of equivalency of the claims are to be embraced within their scope.

What is claimed is:

1. A method for encrypting and decrypting an original data stream comprising:
   (A) transmitting a copy of a key to an interleaver and to a de-interleaver; said interleaver placed at a transmitting end of a communication channel; said de-interleaver placed at a receiving end of said communication channel; wherein said key includes a key-algorithm, said key-algorithm is configured to describe an evolution in time of at least one interleaving parameter; said at least one interleaving parameter being dynamically changed during data transmission through said communication channel according to said key-algorithm; wherein said at least one dynamically changeable interleaving parameter is selected from the group consisting of: {a variable branch number; and a variable register depth}; wherein said variable branch number is a first interleaving parameter being dynamically changed during data transmission through said communication channel; and wherein said variable register depth is a second interleaving parameter being dynamically changed during data transmission through said communication channel;
   (B) interleaving said original data stream by using said interleaver having said at least one dynamically changeable interleaving parameter; wherein said interleaved data stream propagates through said communication channel; and wherein said interleaver compensates for a change in latency caused by said at least one dynamically changeable interleaving parameter; and
   (C) recovering said original data stream from said interleaved data stream propagated through said communication channel by using said de-interleaver adapted to communicate with said communication channel; wherein said de-interleaver includes said at least one said dynamically changeable interleaving parameter; and wherein said de-interleaver compensates for a change in latency caused by said at least one dynamically changeable interleaving parameter.

2. The method of claim 1, wherein said step (A) further comprises:
   (A1) synchronously changing said at least one dynamically changeable interleaving parameter at both ends of said communication channel according to said key-algorithm included in said key.

3. The method of claim 2, wherein said step (A1) further comprises:
   (A1, 1) using a Pseudo-Random Binary sequence (PRBS) generator to generate a PRBS key.

4. The method of claim 1, wherein said step (B) further comprises:
   (B1) using an anticipator block in said interleaver to compensate for latency decrease caused by at least one dynamically changeable interleaving parameter change in said at least one interleaving parameter.

5. The method of claim 1, wherein said step (B) further comprises:
   (B2) using a compensator block in said interleaver to compensate for latency increase caused by at least one dynamically changeable interleaving parameter change in said at least one interleaving parameter.

6. The method of claim 1, wherein said step (C) further comprises:

(C1) using an anticipator block in said de-interleaver to compensate for latency decrease caused by at least one dynamically changeable interleaving parameter change in said at least one interleaving parameter.

7. The method of claim 1, wherein said step (C) further comprises:
(C2) using a compensator block in said de-interleaver to compensate for latency increase caused by at least one dynamically changeable interleaving parameter change in said at least one interleaving parameter.

8. A method for encrypting and decrypting an original data stream comprising:
(A) transmitting a copy of a key to an interleaver; said interleaver placed at a transmitting end of a communication channel; wherein said key includes a key-algorithm, said key-algorithm is configured to describe an evolution in time of at least one interleaving parameter; said at least one interleaving parameter being dynamically changed during data transmission through said communication channel according to said key-algorithm; wherein said at least one dynamically changeable interleaving parameter is selected from the group consisting of: {a variable branch number; and a variable register depth}; wherein said variable branch number is a first interleaving parameter being dynamically changed during data transmission through said communication channel; and wherein said variable register depth is a second interleaving parameter being dynamically changed during data transmission through said communication channel;
and
(B) interleaving said original data stream by using said interleaver having said at least one dynamically changeable interleaving parameter; wherein said interleaved data stream propagates through said communication channel; and wherein said interleaver compensates for a change in latency caused by said at least one dynamically changeable interleaving parameter;
wherein said original data is recovered from said interleaved data stream propagated through said communication channel by using a de-interleaver adapted to communicate with said communication channel; wherein said de-interleaver includes said at least one said dynamically changeable interleaving parameter; and wherein said de-interleaver compensates for a change in latency caused by said at least one dynamically changeable interleaving parameter.

9. A method for encrypting and decrypting an original data stream comprising:
(A) transmitting a copy of a key to a de-interleaver; said de-interleaver placed at a receiving end of a communication channel; wherein said key includes a key-algorithm, said key-algorithm is configured to describe an evolution in time of at least one interleaving parameter; said at least one interleaving parameter being dynamically changed during data transmission through said communication channel according to said key-algorithm; wherein said at least one dynamically changeable interleaving parameter is selected from the group consisting of: {a variable branch number; and a variable register depth}; wherein said variable branch number is a first interleaving parameter being dynamically changed during data transmission through said communication channel; and wherein said variable register depth is a second interleaving parameter being dynamically changed during data transmission through said communication channel; wherein said original data stream was interleaved by using an interleaver having said at least one dynamically changeable interleaving parameter; wherein said interleaved data stream propagates through said communication channel; and wherein said interleaver compensates for a change in latency caused by said at least one dynamically changeable interleaving parameter;
and
(B) recovering said original data stream from said interleaved data stream propagated through said communication channel by using said de-interleaver adapted to communicate with said communication channel; wherein said de-interleaver includes said at least one said dynamically changeable interleaving parameter; and wherein said de-interleaver compensates for a change in latency caused said by at least one dynamically changeable interleaving parameter.

* * * * *